Oct. 14, 1969 E. R. HILL 3,472,690

PROCESS OF PREPARING A FLEXIBLE REAR WALL PHOTOVOLTAIC CELL

Filed Feb. 9, 1967

EDWIN R. HILL INVENTOR

Walter J. Monacelli ATTORNEY 3,472,690

PROCESS OF PREPARING A FLEXIBLE REAR WALL PHOTOVOLTAIC CELL

Edwin R. Hill, Chardon, Ohio, assignor to Kewanee Oil Company, Bryn Mawr, Pa., a corporation of Delaware Filed Feb. 9, 1967, Ser. No. 614,877
Int. Cl. H01b *1/02;* B44d *1/18*
U.S. Cl. 117—215 6 Claims

ABSTRACT OF THE DISCLOSURE

This invention comprises the process of preparing a flexible rear wall cadmium sulfide solar cell by the steps of exposing a copper-coated flexible substrate, such as molybdenum or other suitable metal, or suitable non-metal such as plastic, to an atmosphere of hydrogen sulfide at 500–700° C. for a sufficient period to convert the copper to cuprous sulfide, and thereafter exposing the resultant cuprous sulfide to cadmium sulfide vapors in such a manner that the cadmium sulfide condenses on the cuprous sulfide to form a cadmium sulfide component of a cadmium sulfide photovoltaic cell. By attachment of electrodes directly or indirectly to the cadmium sulfide layer and to the cuprous sulfide barrier, or the metallic substrate, and exposing the cell to light, a voltage of at least about 0.40 volts is readily obtained.

Figure 1:
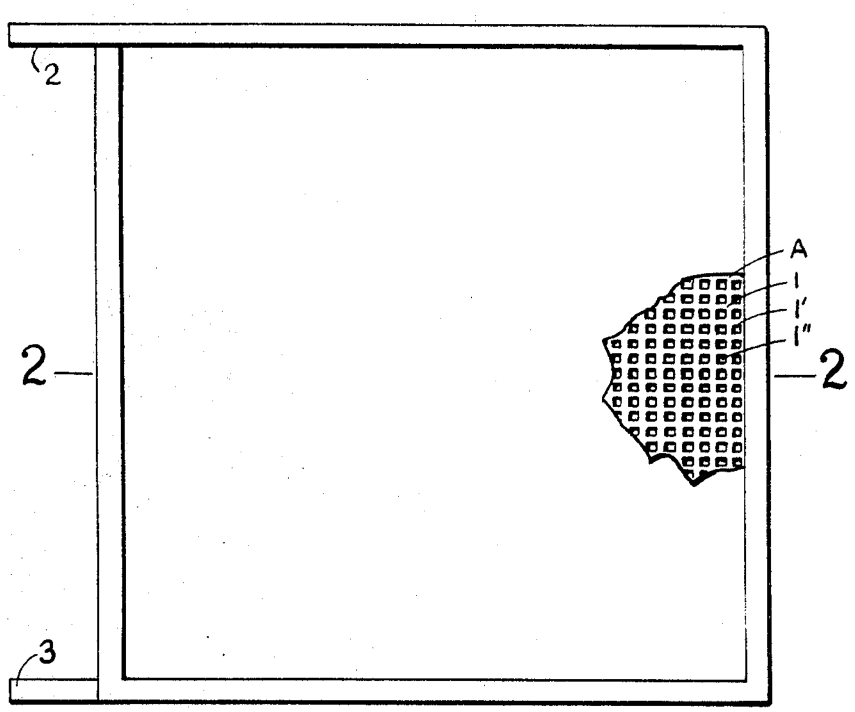

This invention relates to a process for preparing a flexible rear wall cadmium sulfide solar cell. More particularly, it relates to a process of preparing a flexible rear wall cadmium sulfide solar cell in which a cuprous sulfide layer is formed on a metal substrate, such as molybdenum and a cadmium sulfide film or coating is thereafter deposited on the cuprous sulfide layer. Still more particularly, it relates to a process of preparing a photovoltaic cell by exposure of the copper layer of a copper-clad molybdenum, or copper-clad plastic, such as polyethylene, polystyrene, epoxy resin, polypropylene, etc., to an atmosphere of hydrogen sulfide under appropriate conditions to convert the copper to cuprous sulfide, and thereafter exposing the cuprous sulfide barrier to cadmium sulfide vapor and thereby depositing a film of cadmium sulfide.

Solar cells operate on the principle of conversion of light energy to electrical energy. Cadmium sulfide solar cells comprise a film of cadmium sulfide deposited on a substrate such as a thin film of molybdenum. A barrier is formed on one side of the cadmium sulfide film. If the barrier is on the front side of the cadmium sulfide, the solar cell is referred to as a front wall solar cell. If the barrier is between the cadmium sulfide layer and the substrate, the cell is referred to as a rear wall solar cell.

Without going into an explanation of how the power is generated, the incidence of light on the barrier, or, as some maintain, on the cadmium sulfide, produces power in the cadmium sulfide and barrier layers. By connecting appropriate lead wires to the barrier and to the cadmium sulfide film, a circuit can be formed for the flow of electrical power.

Front wall solar cells have the advantage of greater simplicity in construction and also have the advantage that the barrier layer is more easily exposed to light rays. However, the barrier is more susceptible to reaction with moisture, oxygen and other reagents that may be found in the atmosphere to which the barrier is exposed. Since the cadmium sulfide film is much more resistant to reaction with such materials than the barrier, it is well recognized that a rear wall cadmium sulfide solar cell has the advantage of greater resistance to moisture and atmospheric conditions. However, it has been found difficult to deposit a barrier on the substrate and then to deposit the cadmium sulfide film or layer on such a barrier.

In accordance with the practice of this invention it has been found possible to prepare a flexible, rear wall cadmium sulfide solar cell by exposing a copper-coated or copper-clad substrate such as molybdenum or other suitable metal to a hydrogen sulfide atmosphere at 500–700° C. for an appropriate period to convert the copper to cuprous sulfide. Generally, such exposure for 15 minutes is found satisfactory although shorter or longer periods can be used, depending on the thickness of barrier desired. It is generally desirable to have a layer of cuprous sulfide at least one micron thick. For such a minimum thickness, it is generally satisfactory to have a copper layer at least 0.5 micron in thickness.

Following the formation of the cuprous sulfide, this layer is exposed to cadmium sulfide vapors in such a manner that the cadmium sulfide condenses on the cuprous sulfide surface and forms a continuous cadmium sulfide layer. For such purposes the cadmium sulfide is heated to a temperature of approximately 900–1200° C. for volatilization and the resulting vapors condensed onto the cuprous sulfide on the molybdenum or other substrate maintained at a temperature of about 200–300° C. This exposure to the cadmium sulfide vapors deposits the cadmium sulfide layer on the barrier with only a moderate rise in temperature, generally no more than about 5° C. due to contact with the hot vapors.

Figure 2:
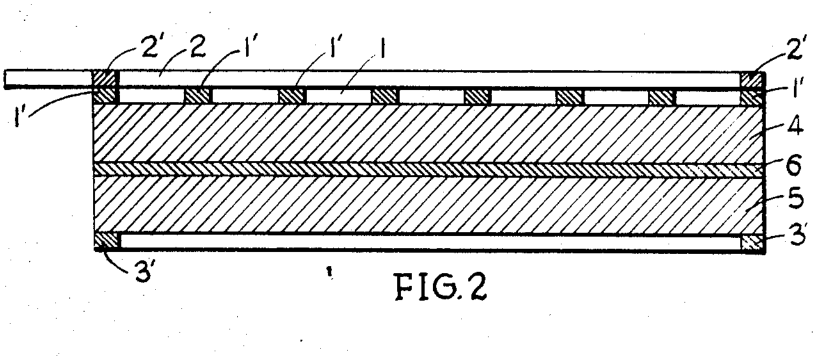

FIG. 1 of the drawings shows a top view of a solar cell of this invention;

FIG. 2 shows the details of structure by an elevational cross-sectional view of the same cell of FIG. 1 taken at line 2—2.

In such a rear wall solar cell, the light reaches the barrier by passing through the cadmium sulfide layer. The cadmium sulfide is transparent to most light having a wave length of 510 millimicrons or greater. Wave lengths shorter than 1000 millimicrons are suitable for activating the barrier in a manner which will generate power in the barrier layer.

By attachment of electrodes to the cadmium sulfide, preferably through a current collector or grid, and to the barrier, preferably by attachment to the molybdenum or other metal substrate, the cell is ready for use. Upon exposure to light, a voltage of 0.40 v. is readily obtained from this cell.

While there is nothing critical about the thickness of the molybdenum substrate, generally a thickness of 1–2 millimeters, or even larger is satisfactory. Generally, cadmium sulfide layers of 15–30 microns thickness are suitable, preferably about 20 microns.

In the drawings, FIG. 1 shows a top view of a solar cell of this invention on which a collector grid 4 has been superimposed on the cadmium sulfide layer. The various layers below the collector grid cannot be depicted in FIG. 1 since they are hidden below the collector grid. Enlarged section A shows the openings in the grid through which light passes to the layers beneath.

FIG. 2 shows an elevational cross-sectional view taken at lines 2—2 of FIG. 1. The cuprous sulfide layer 6 is shown supported on the substrate 5 and is covered on the opposite side by the cadmium sulfide layer 4, which in turn has the collector grid 1 superimposed thereon. The collector grid has a lead wire 2 extending therefrom and running around the periphery of the grid. Actually, this lead wire is a thin narrow strip of copper foil. A second lead wire 3 extends from the substrate and is in contact with the substrate at its lower periphery so as to facilitate the flow of current. The cross-section of the grid is shown exaggerated in size as compared to the respective dimensions in FIG. 1. The grid is generally formed by etching a number of holes or open spaces 1'' of desired size in a metal foil. One side of the opening is shown as 1'.

Various methods of practicing the invention are illustrated by the following examples. These examples are intended merely to illustrate the invention and not in any sense to limit the manner in which the invention can be practiced. The parts and percentages recited therein and all through the specification, unless specifically provided otherwise are by weight.

EXAMPLE I

A molybdenum sheet 2 mils thick clad with a ½ mil thick layer of copper is heated for 15 minutes in blowing $H_2S$ gas at 600° C. This forms a polycrystalline layer of $Cu_2S$. A layer of CdS 1 mil thick is vacuum deposited on the $Cu_2S$ layer. An indium stripe is soldered to the periphery of the CdS layer for the negative electrical lead and the molybdenum substrate provides the positive terminal. A photovoltaic diode results which generates 2 ma./cm.$^2$ short circuit current and 0.4 volt open circuit under tungsten simulated sunlight.

EXAMPLE II

The procedure of Example I is repeated with similar results using a copper clad polyethylene sheet in place of the molybdenum sheet and attaching a copper strip to the $Cu_2S$ layer as the positive terminal.

The invention claimed is:

1. The process for preparing a photovoltaic cell comprising the steps of:

(a) exposing the copper surface of a copper-coated substrate to an atmosphere of hydrogen sulfide maintained at a temperature of 500–700° C. until the copper in said coating is converted to cuprous sulfide;

(b) cooling the resultant cuprous sulfide-coated substrate to approximately 200–300° C.;

(c) exposing said cuprous sulfide coating to cadmium sulfide vapors while said coating is maintained at a temperature of about 200–300° C. for a period sufficient to deposit a continuous layer of condensed cadmium sulfide over the cuprous sulfide coating.

2. The process of claim 1 in which said copper coating has a thickness of at least 0.5 micron.

3. The process of claim 1 in which said substrate metal is molybdenum.

4. The process of claim 1 in which said cadmium sulfide is deposited until a film of at least 10 microns thickness is formed.

5. The proces sof claim 1 in which said substrate is a plastic.

6. The process of claim 1 in which said substrate is polyethylene.

References Cited

UNITED STATES PATENTS

| | | | |
|---|---|---|---|
| 3,374,108 | 4/1968 | Keramidas | 136—89 |
| 3,411,050 | 11/1968 | Middleton et al. | 136—89 |

ALFRED L. LEAVITT, Primary Examiner

M. F. ESPOSITO, Assistant Examiner

U.S. Cl. X.R.

117—106, 127, 138.8, 200; 136—89